(12) United States Patent
Liao

(10) Patent No.: US 10,700,139 B2
(45) Date of Patent: Jun. 30, 2020

(54) MICRO LED DISPLAY AND METHOD OF MANUFACTURING THE SAME

(71) Applicant: ASTI GLOBAL INC., TAIWAN, Changhua County (TW)

(72) Inventor: Chien-Shou Liao, New Taipei (TW)

(73) Assignee: ASTI GLOBAL INC., TAIWAN, Changhua County (TW)

( * ) Notice: Subject to any disclaimer, the term of this patent is extended or adjusted under 35 U.S.C. 154(b) by 0 days.

(21) Appl. No.: 16/194,667

(22) Filed: Nov. 19, 2018

(65) Prior Publication Data
US 2019/0319073 A1 Oct. 17, 2019

(30) Foreign Application Priority Data
Apr. 11, 2018 (TW) ................. 107112398 A

(51) Int. Cl.
| | |
|---|---|
| *H01L 33/00* | (2010.01) |
| *H01L 27/12* | (2006.01) |
| *H01L 25/16* | (2006.01) |
| *H01L 27/15* | (2006.01) |
| *H01L 33/62* | (2010.01) |
| *H01L 25/075* | (2006.01) |
| *H01L 27/32* | (2006.01) |
| *H01L 33/38* | (2010.01) |
| *H01L 33/50* | (2010.01) |
| *H01L 33/60* | (2010.01) |
| *H01L 33/40* | (2010.01) |

(52) U.S. Cl.
CPC .......... *H01L 27/322* (2013.01); *H01L 27/156* (2013.01); *H01L 33/385* (2013.01); *H01L 33/405* (2013.01); *H01L 33/502* (2013.01); *H01L 33/508* (2013.01); *H01L 33/60* (2013.01); *H01L 33/62* (2013.01)

(58) Field of Classification Search
CPC ... H01L 25/50; H01L 33/0079; H01L 27/124; H01L 27/1262; H01L 25/167; H01L 27/156; H01L 33/62; H01L 25/0753
See application file for complete search history.

(56) References Cited

U.S. PATENT DOCUMENTS

2017/0069611 A1* 3/2017 Zhang .................. H01L 25/167
2017/0179097 A1* 6/2017 Zhang .................. H01L 25/167

* cited by examiner

*Primary Examiner* — Sonya McCall-Shepard
(74) *Attorney, Agent, or Firm* — Li & Cai Intellectual Property (USA) Office

(57) ABSTRACT

A micro LED display and a method of manufacturing the same are provided. The micro LED display includes a wafer-level substrate, an adhesive layer, a light-emitting assembly, and a conductive structure. The wafer-level substrate includes a plurality of control circuits, wherein each control circuit has a conductive contact. The adhesive layer is disposed on the wafer-level substrate. The light emitting assembly includes a plurality of LED structures disposed on the adhesive layer. The conductive structure is electrically connected between the LED structures and the control circuits corresponding to each other. Thereby, the light-emitting assembly having the plurality of LED structures and the wafer-level substrate having the plurality of control circuits can be connected with each other via the adhesive layer.

3 Claims, 15 Drawing Sheets

MICRO LED DISPLAY AND METHOD OF MANUFACTURING THE SAME

CROSS-REFERENCE TO RELATED PATENT APPLICATION

This application claims the benefit of priority to Taiwan Patent Application No. 107112398, filed on Apr. 11, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a display and a method of manufacturing the same, and more particularly to a micro LED display and a method of manufacturing the same.

BACKGROUND OF THE DISCLOSURE

Currently, light-emitting diodes (LED) are widely applied for its good light quality and high luminous efficiency. Generally, conventional full-color LED display devices include red, green, and blue LED chips cooperating together to widen color gamut and enhance the color rendering. The red, green, and blue LED chips can respectively emit red, green, and blue colored lights. Therefore, the full-color LED display devices can produce a full-color light by directly emitting the single red, green, or blue colored lights or superposing at least two of the red, green, blue colored lights to display the colored information.

SUMMARY OF THE DISCLOSURE

In response to the above-referenced technical inadequacies, the present disclosure provides a micro LED display and a method for manufacturing the same.

In one aspect, the present disclosure provides a micro LED display. The micro LED display includes a wafer-level substrate, an adhesive layer, a light-emitting assembly, an insulating layer, and a conductive structure. The wafer-level substrate includes a wafer body, a plurality of control circuits built in the wafer body, and a plurality of ground circuits built in the wafer body. Each of the plurality of control circuits has a conductive contact exposed from the wafer body and each of the plurality of ground circuits has a ground contact exposed from the wafer body. The adhesive layer is disposed on the wafer body. The light-emitting assembly includes a plurality of LED structures disposed on the adhesive layer and not contacting the plurality of LED structures of the wafer-level substrate. Each of the LED structures has a first electrode terminal and a second electrode terminal. An insulating layer is formed on the wafer-level substrate and the light-emitting assembly. The conductive contact of each of the control circuits, the ground contact of each of the round circuits, and the first electrode terminal and the second electrode terminal of each of the LED structures are exposed from the insulating layer. The conductive structure includes a plurality of first conductive layers and a plurality of second conductive layers. Each of the first conductive layers is electrically connected between the corresponding first electrode terminal and the corresponding conductive contact, and each of the second conductive layers is electrically connected between the corresponding second electrode terminal and the corresponding ground contact.

In one aspect, the present disclosure provides a micro LED display. The micro LED display includes a wafer-level substrate, an adhesive layer, a light-emitting assembly, and a conductive structure. The wafer-level substrate includes a plurality of control circuits, and each of the control circuits has a conductive contact. The adhesive layer is disposed on the wafer-level substrate. The light-emitting assembly includes a plurality of LED structures disposed on the adhesive layer. The conductive structure is electrically connected between the LED structures and the control circuits corresponding to each other.

In one aspect, the present disclosure provides a method for manufacturing a micro LED display including: providing a wafer-level substrate, wherein the wafer-level substrate includes a plurality of control circuits, and each of the control circuits has a conductive contact; connecting a composite material structure with the wafer-level substrate via an adhesive layer; removing a bottom layer of the composite material structure and retaining a retained layer of the composite material structure; fabricating a plurality of LED structures disposed on the adhesive layer from the retained layer of the composite material structure; and forming a conductive structure electrically connected between the LED structures and the control circuits corresponding to each other.

Therefore, the micro LED display and the method for manufacturing the same of the present disclosure have the technical features of "disposing the adhesive layer on the wafer-level substrate, and the light-emitting assembly including the plurality of LED structures disposed on the adhesive layer" or "connecting a composite material structure with the wafer-level substrate via the adhesive layer, removing a bottom layer of the composite material structure, retaining a retained layer of the composite material structure, and fabricating the plurality of LED structures disposed on the adhesive layer from the retained layer of the composite material structure" to connect "the light-emitting assembly including the plurality of LED structures" and "the wafer-level substrate having the plurality of control circuits" with each other via the adhesive layer.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
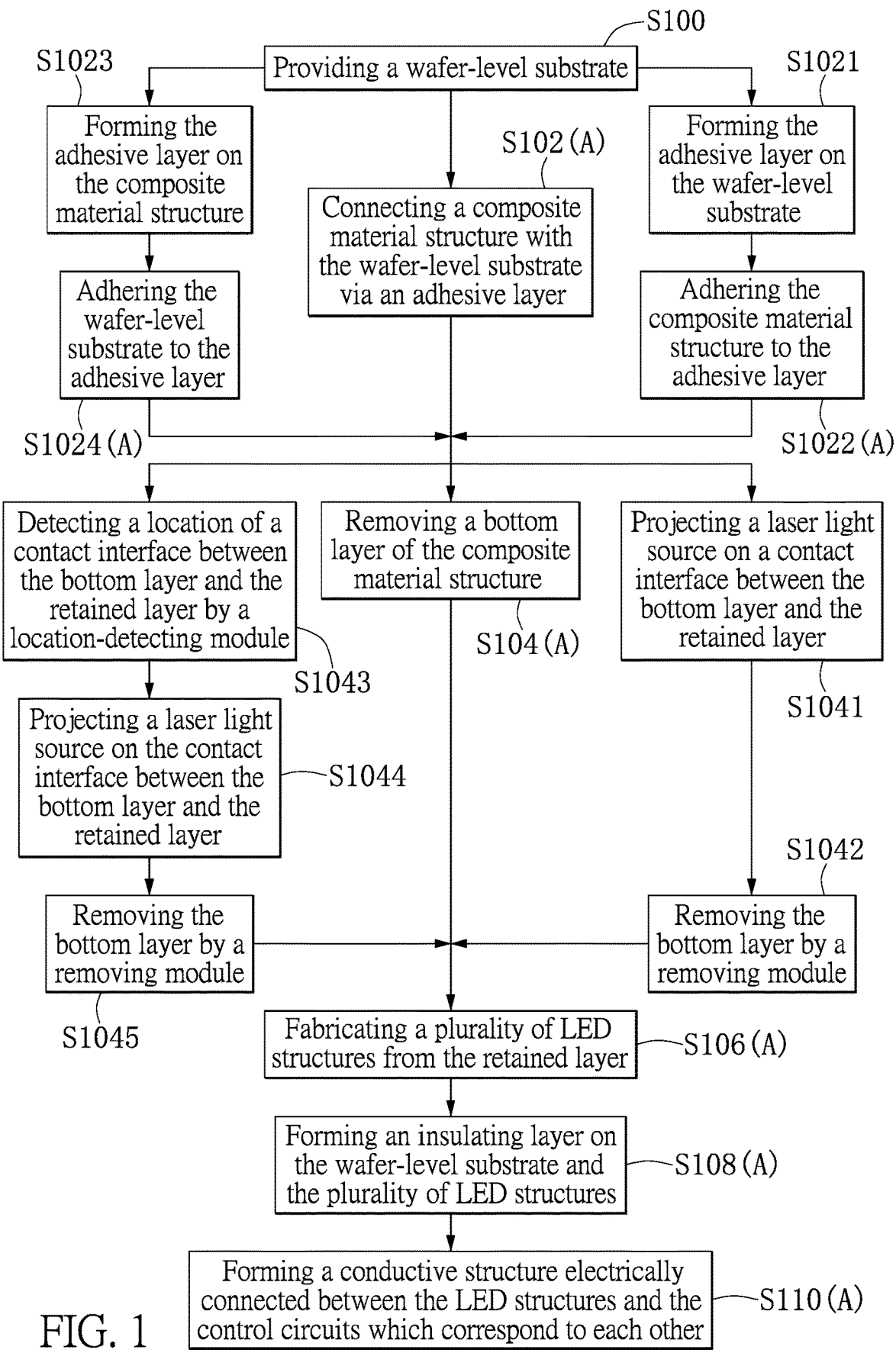
FIG. 1 is a flowchart of a method for manufacturing a micro LED display according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, a method for manufacturing a micro light-emitting dioxide (LED) display of a first embodiment of the present disclosure is provided.

Figure 2:
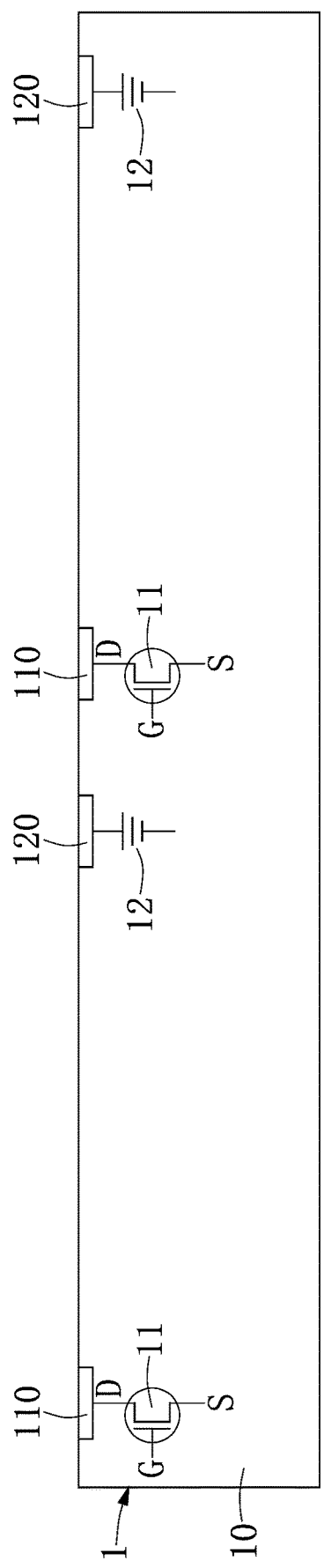
FIG. 2 is a schematic view of step S100 of the method for manufacturing the micro LED display according to the first embodiment of the present disclosure.

Firstly, referring to FIG. 1 and FIG. 2, a wafer-level substrate 1 is provided. The wafer-level substrate 1 includes a plurality of control circuits 11 and each of the control circuits 11 has a conductive contact 110 (step S100). Further, the wafer-level substrate 1 includes a wafer body 10 and a plurality of ground circuits 12 built in the wafer-level substrate 1. The plurality of control circuits 11 are built in the wafer body 10. In addition, the conductive contact 110 of each of the control circuits 11 is exposed from the wafer body 10 and each of the ground circuit 12 has a ground contact 120 exposed from the wafer body 10. For example, the wafer-level substrate 1 can be any one of a polished silicon wafer, an epitaxial silicon wafer, an argon anneal silicon wafer, a hai silicon wafer, and a silicon on insulator silicon wafer. The control circuit 11 can be a complementary metal-oxide-semiconductor (CMOS) control circuit. The CMOS control circuit has a source S, a drain D, and a gate G However, the present disclosure is not limited thereto.

Figure 3:
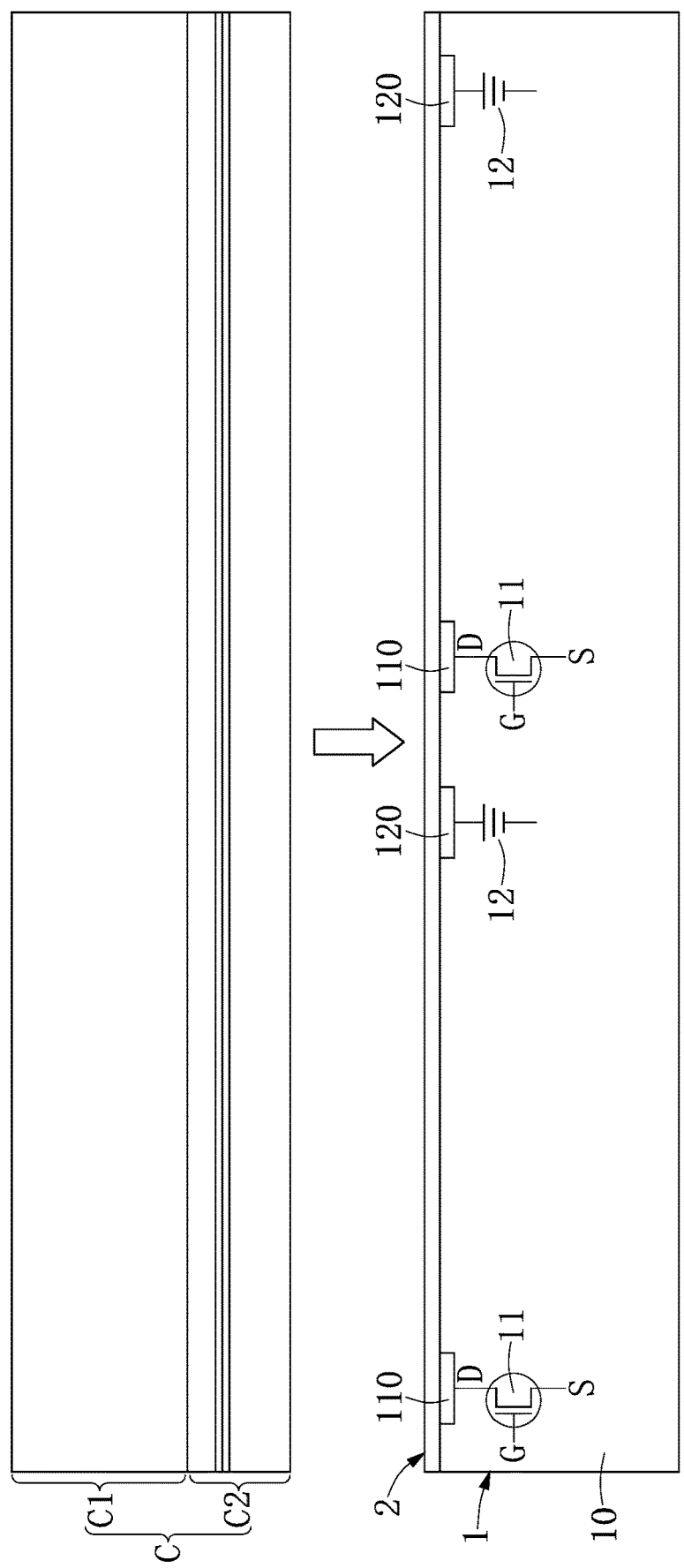
FIG. 3 is a schematic view of step S1021 of the method for manufacturing the micro LED display according to the first embodiment of the present disclosure.
Figure 4:
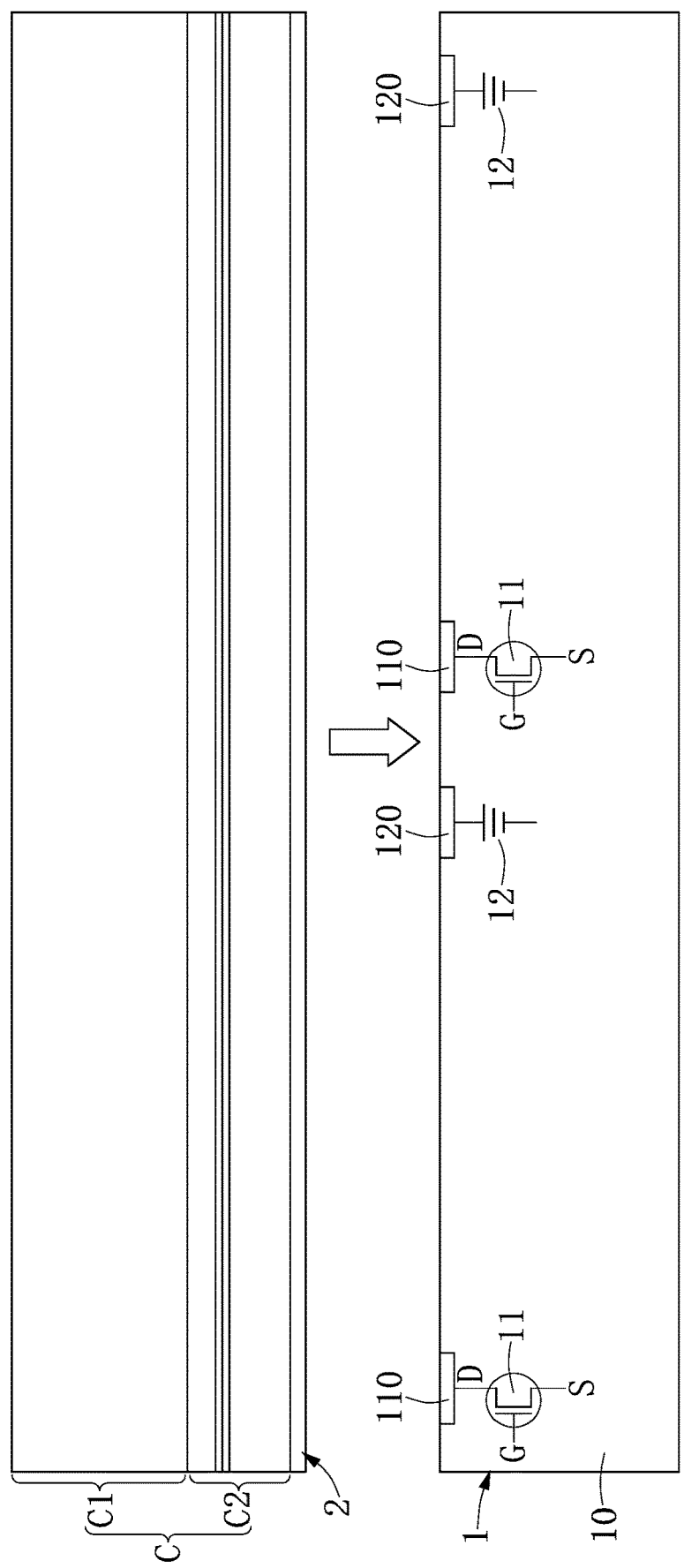
FIG. 4 is a schematic view of step S1023 of the method for manufacturing the micro LED display according to the first embodiment of the present disclosure.

Referring to FIG. 1, FIG. 3, and FIG. 4, a composite material structure C and the wafer-level substrate 1 are connected with each other via an adhesive layer 2 (step S102(A)). For example, a coefficient of thermal expansion of the adhesive layer 2 and a coefficient of thermal expansion of the wafer-level substrate 1 are the same or similar to each other. The adhesive layer 2 can be any one of a polyetheretherketone (PEEK) adhesive layer, a benzocyclobutene (BCB) adhesive layer, and a hydrogen silsesquioxane (HSQ) adhesive layer. However, the present disclosure is not limited thereto.

Figure 5:
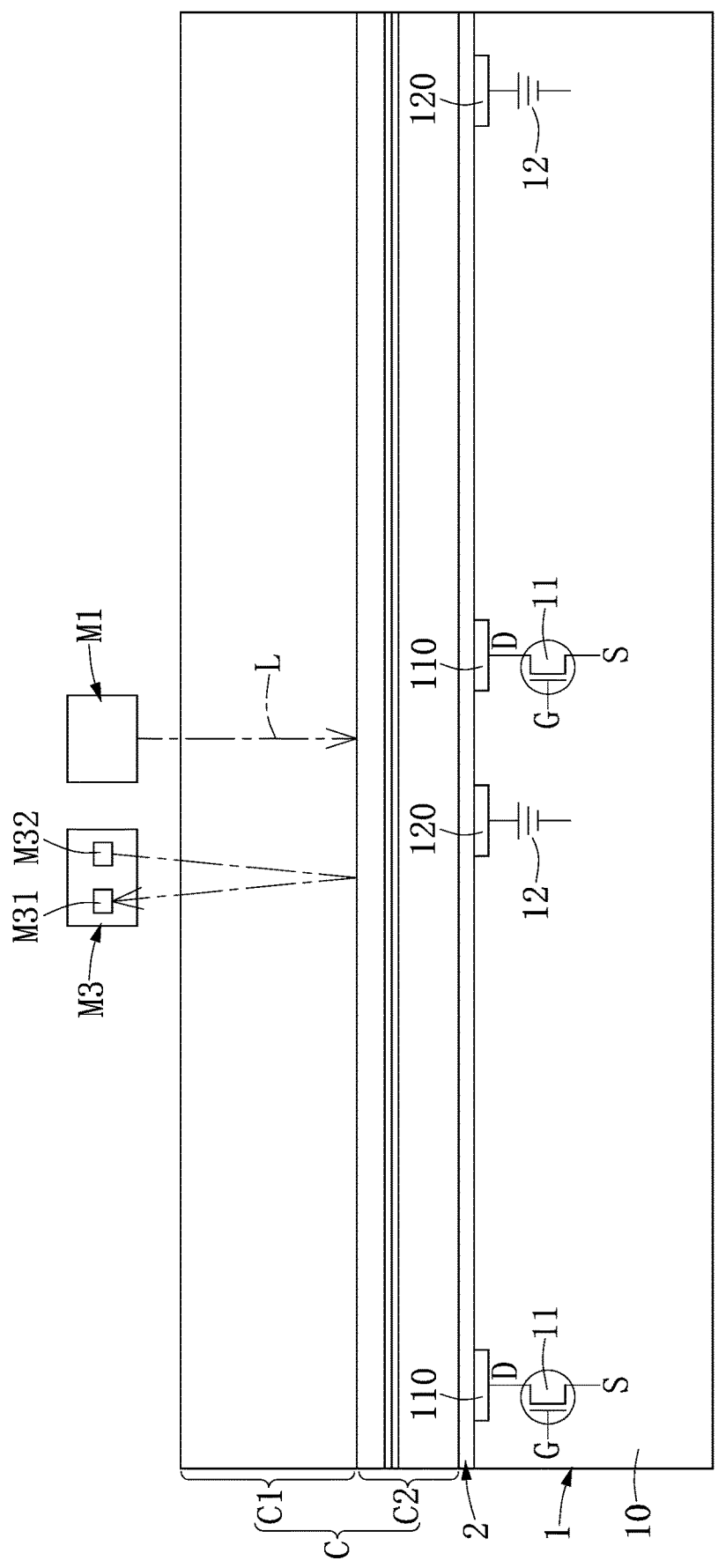
FIG. 5 is a schematic view of step S102(A) of the method for manufacturing the micro LED display according to the first embodiment of the present disclosure.

For instance, referring to FIG. 1, FIG. 3, and FIG. 5, the step S102 of the present disclosure further includes that the adhesive layer 2 is firstly formed on the wafer-level substrate 1 as shown in FIG. 3 (step S1021). Then, the composite material structure C is adhered to the adhesive layer 2 to connect the composite material structure C with the wafer-level substrate 1 as shown in FIG. 5 (step S1022(A)). However, the example illustrated above is only one of the available embodiments and should not be taken as limiting the scope of the present disclosure.

For instance, referring to FIG. 1, FIG. 4, and FIG. 5, the step S102 of the present disclosure further includes that the adhesive layer 2 is firstly formed on the composite material structure C as shown in FIG. 4 (step S1023). Then, the adhesive layer 2 is adhered to the wafer-level substrate 1 to connect the composite material structure C with the wafer-level substrate 1 as shown in FIG. 5 (step S1024(A)). However, the example illustrated above is only one of the available embodiments and should not be taken as limiting the scope of the present disclosure.

Figure 6:
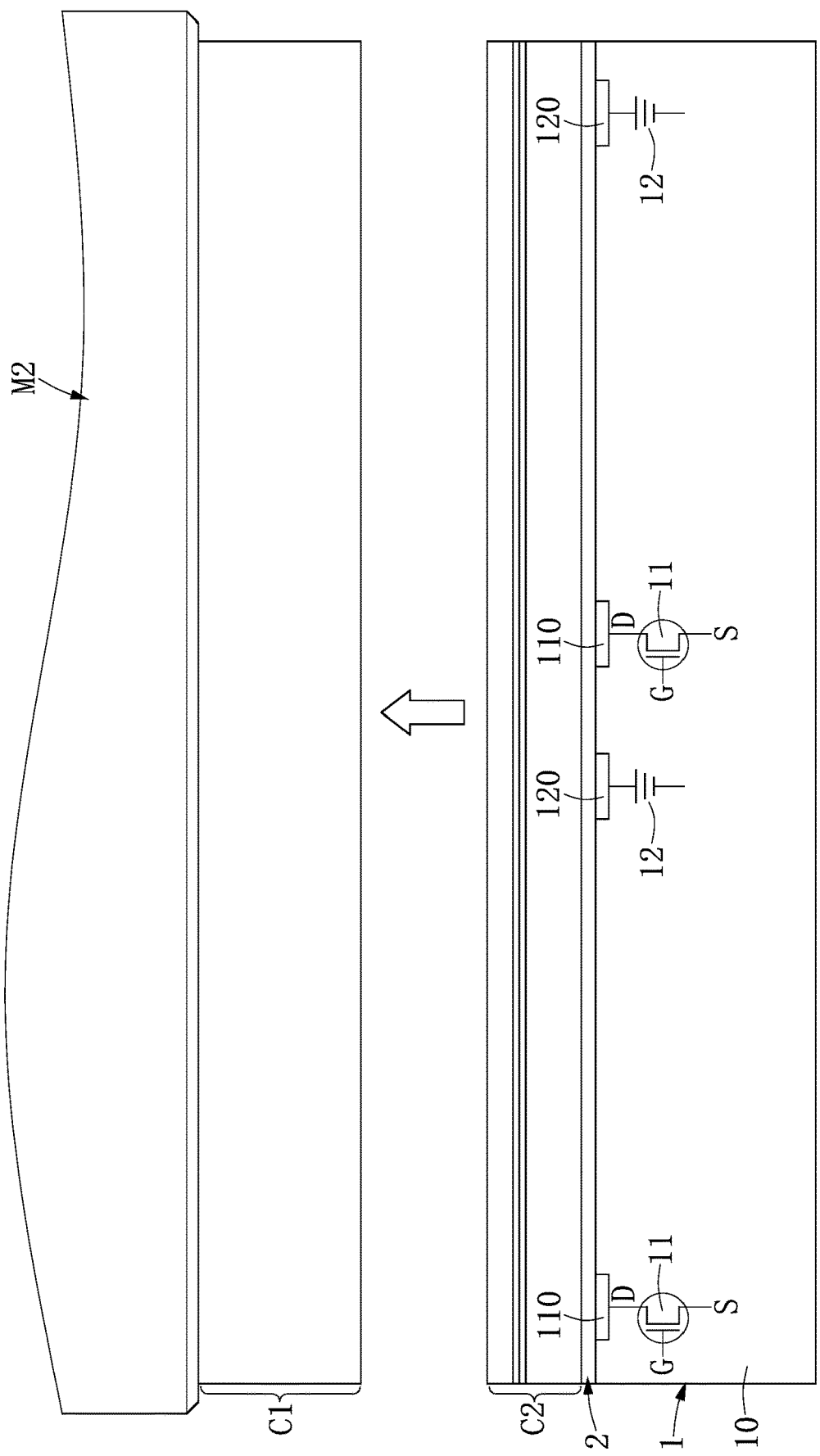
FIG. 6 is a schematic view of step S104(A) of the method for manufacturing the micro LED display according to the first embodiment of the present disclosure.

Then, referring to FIG. 1, FIG. 5, and FIG. 6, a bottom layer C1 of the composite material structure C is removed and a retained layer C2 of the composite material structure C is retained (step S104(A)). For example, the bottom layer C1 of the composite material layer C can be a sapphire material layer, and the retained layer C2 of the composite material layer C can be a gallium nitride material layer. Further, the bottom layer C2 can also be a quartz bottom layer, a glass bottom layer, a silicon bottom layer, or a bottom layer of any other material. Nevertheless, the example illustrated above is one of the available embodiments and should not be taken as limiting the scope of the present disclosure.

For instance, referring to FIG. 1, FIG. 5, and FIG. 6, the step S104 of the present disclosure further includes that a light from a laser light source L produced by a laser producing module M1 is firstly projected on a contact interface between the bottom layer C1 and the retained layer C2 to weaken a binding force between the bottom layer C1 and the retained layer C2 as shown in FIG. 5 (step S1041). Then, the bottom layer C1 is removed from the retained layer C2 by a removing module M2 so that the retained layer C2 remains adhered to the adhesive layer 2 such that the retained layer C2 is exposed outside as shown in FIG. 6 (step S1042). It should be noted that, the removing module M2 can be a vacuum suction nozzle or any other clamping devices.

However, the example illustrated above is only one of the available embodiments and should not be taken as limiting the scope of the present disclosure.

For instance, referring to FIG. 1, FIG. 5, and FIG. 6, the step S104 of the present disclosure further includes that a location of a contact interface between the bottom layer C1 and the retained layer C2 is firstly detected by a location-detecting module M3, and the location-detecting module M3 includes at least a sensing component M31 for receiving a detecting wave as shown in FIG. 5 (step S1043). Then, a light from a laser light source L produced by a laser producing module M1 is projected on the contact interface between the bottom layer C1 and the retained layer C2 to weaken a binding force between the bottom layer C1 and the retained layer C2 as shown in FIG. 5 (step S1044). Subsequently, the bottom layer C1 is removed from the retained layer C2 by a removing module M2 so that the retained layer C2 remains adhered to the adhesive layer 2 such that the retained layer C2 is exposed outside (step S1045). It should be noted that, the location-detecting module M3 further includes an emitting component M32 for emitting a detecting wave. The detecting wave received by the sensing component M31 can be provided by the emitting component M32 or the laser producing module M1. However, the example illustrated above is only one of the available embodiments and should not be taken as limiting the scope of the present disclosure.

Figure 7:
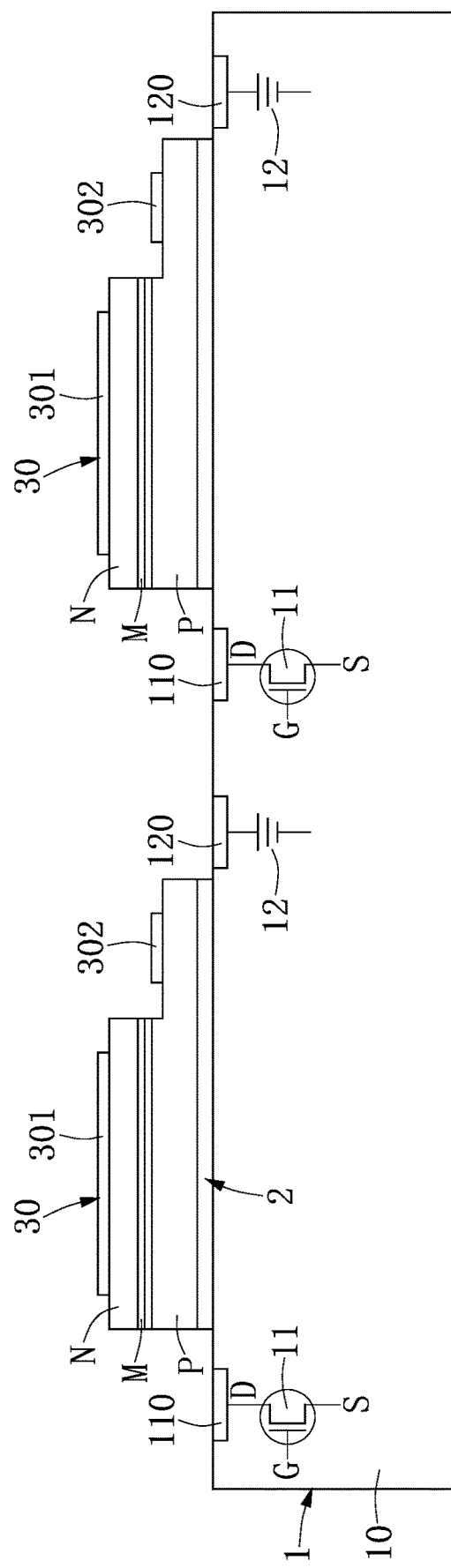
FIG. 7 is a schematic view of step S106(A) of the method for manufacturing the micro LED display according to the first embodiment of the present disclosure.

Referring to FIG. 1, FIG. 6, and FIG. 7, a plurality of LED structures 30 adhered to the adhesive layer 2 is fabricated from the retained layer C2 of the composite material structure C (step S106(A)). For example, the retained layer C2 is fabricated into the plurality of LED structures 30 by a semiconductor process or a non-semiconductor process. Each of the LED structures 30 has a first electrode terminal 301 and a second electrode terminal 302. The first electrode terminal 301 and the second electrode terminal 302 are fabricated onto the corresponding LED structures 30 by a subsequent processing. Furthermore, each of the LED structures 30 includes an n-type conductive layer N, a light-emitting layer M, and a p-type conductive layer P. The n-type conductive layer N can be an n-type gallium nitride material layer (n-GaN). The light-emitting layer M can be a multiple quantum well (MQW) structure layer. The p-type conductive layer P can be a p-type gallium nitride material layer (p-GaN). However, the present disclosure is not limited thereto.

Figure 8:
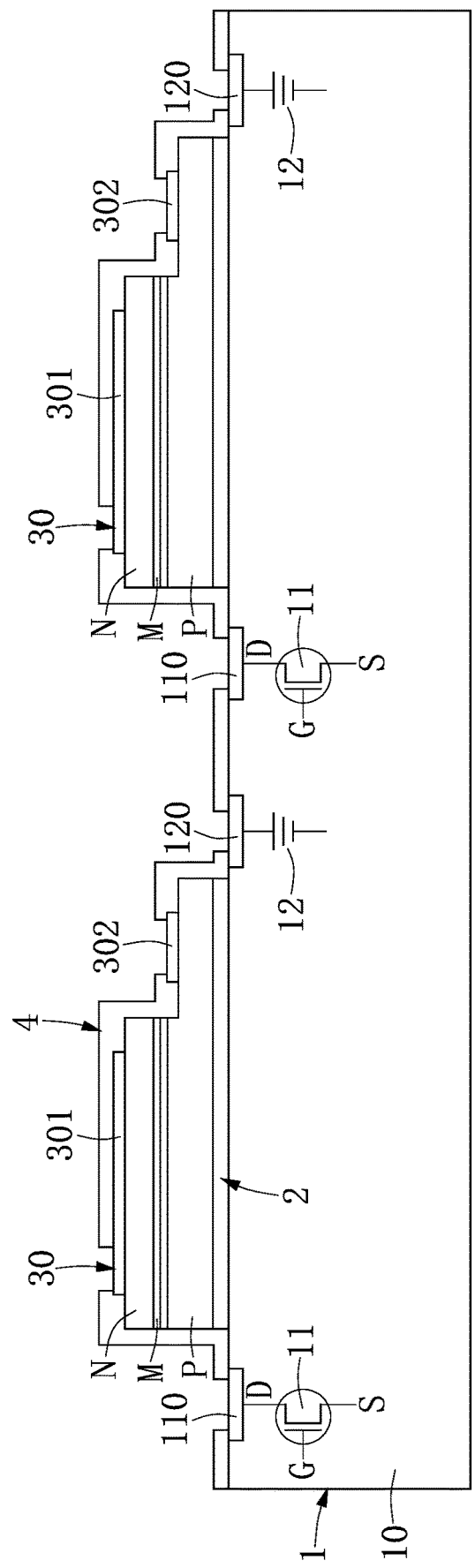
FIG. 8 is a schematic view of step S108(A) of the method for manufacturing the micro LED display according to the first embodiment of the present disclosure.

Referring to FIG. 1, FIG. 7, and FIG. 8, an insulating layer 4 is formed on the wafer-level substrate 1 and the plurality of LED structures 30 (step S108(A)). For example, the conductive contact 110 of each of the control circuits 11, the ground contact 120 of each of the ground circuits 12, and the first electrode terminal 301 and the second electrode terminal 302 of each of the LED structures 3 are fully or partially exposed from the insulating layer 4. It should be noted that, the insulating layer 4 of the present disclosure can be a single insulator or a combination of a plurality of insulators. However, the present disclosure is not limited thereto.

Figure 9:
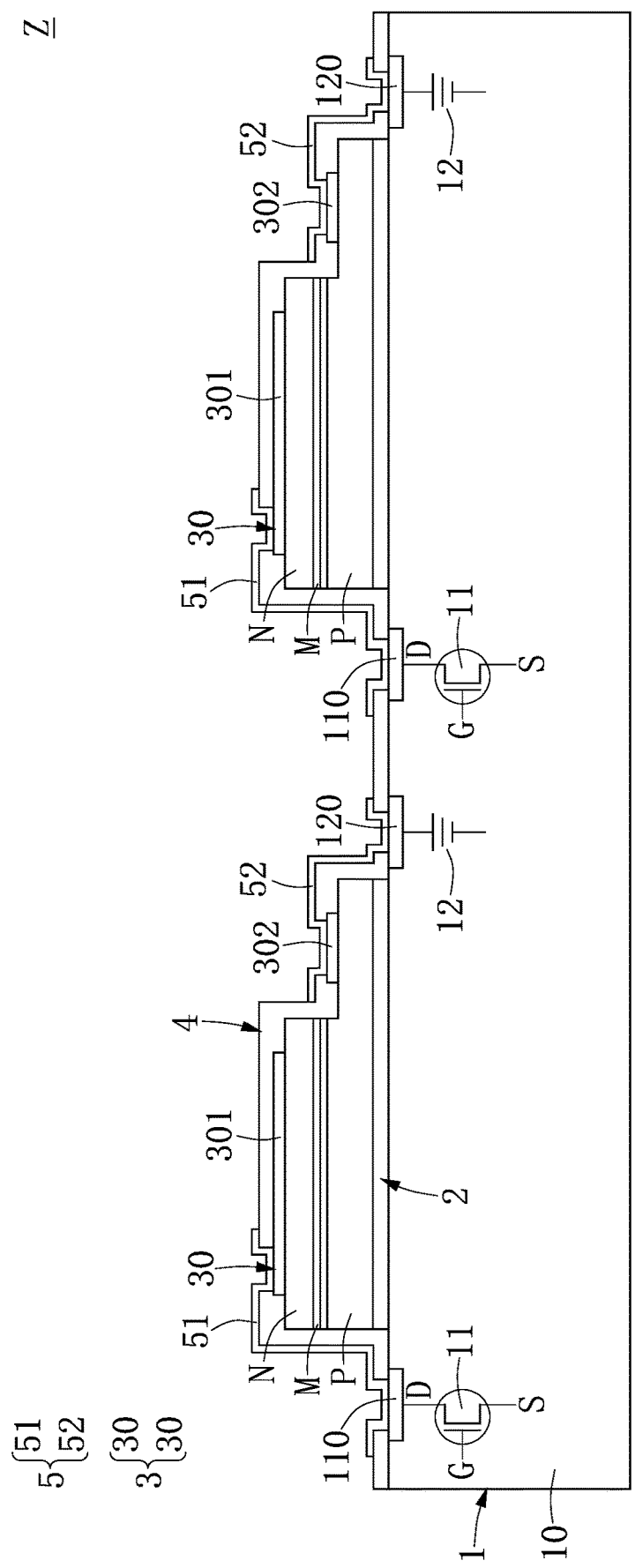
FIG. 9 is a schematic view of step S110(A) of the method for manufacturing the micro LED display according to the first embodiment of the present disclosure.

Then, referring to FIG. 1, FIG. 8, and FIG. 9, a conductive structure 5 is formed and electrically connected between the LED structures 30 and the control circuits 11 corresponding to each other (step S110(A)). For example, the LED structures 30 can be a red LED, a green LED, or a blue LED, but not limited thereto.

Further, referring to FIG. 9, the conductive structure 5 includes a plurality of first conductive layers 51 and a plurality of second conductive layers 52. Each of the first conductive layers 51 is electrically connected between the corresponding first electrode terminal 301 and the corresponding conductive contact 110. Each of the second conductive layers 52 is electrically connected between the corresponding second electrode terminal 302 and the corresponding ground contact 120.

Further, referring to FIG. 9, each of the first conductive layers 51 extends along the insulating layer 4 and fully covers the corresponding first electrode terminal 301 and the corresponding conductive contact 110. Each of the second conductive layers 52 extends along the insulating layer 4 and fully covers the corresponding second electrode terminal 302 and the corresponding contact 120.

In conclusion, referring to FIG. 9, a micro LED display Z of the first embodiment of the present disclosure is provided which includes a wafer-level substrate 1, an adhesive layer 2, a light-emitting assembly 3, and a conductive structure 5. The wafer-level substrate 1 includes a plurality of control circuits 11. Each of the control circuits 11 has a conductive contact 110. The adhesive layer 2 is disposed on the wafer-level substrate 1. The light-emitting assembly 3 includes a plurality of LED structures 30 disposed on the adhesive layer 2. The conductive structure 5 is electrically connected between the LED structures 30 and the control circuits 11 corresponding to each other.

For instance, referring to FIG. 9, the micro LED display Z of the first embodiment of the present disclosure includes a wafer-level substrate 1, an adhesive layer 2, a light-emitting assembly 3, an insulating layer 4, and a conductive structure 5. The wafer-level substrate 1 includes a wafer body 10, a plurality of control circuits 11 built in the wafer body 10, and a plurality of ground circuits 12 built in the wafer body 10. Each of the control circuits 11 has a conductive contact 110 exposed from the wafer body 10. Each of the ground circuits 12 has a ground contact 120 exposed from the wafer body 10. The adhesive layer 2 is disposed on the wafer body 10. The light-emitting assembly 3 includes a plurality of LED structure 30 disposed on the adhesive layer 2 and not contacting the wafer-level substrate 1. Each of the LED structures 30 has a first electrode terminal 301 and a second electrode terminal 302. The insulating layer 4 is formed on the wafer-level substrate 1 and the light-emitting assembly 3. The conductive contact 110 of each of the control circuits 11, the ground contact 120 of each of the ground circuits 12, and the first electrode terminal 301 and the second electrode terminal 302 of each of the LED structures 30 are exposed from the insulating layer 4. The conductive structure 5 includes a plurality of first conductive layers 51 and a plurality of second conductive layers 52. Each of the first conductive layers 51 is electrically connected between the corresponding first electrode terminal 301 and corresponding conductive contact 110. Each of the second conductive layers 52 is electrically connected between the corresponding second electrode terminal 302 and corresponding ground contact 120. Therefore, the LED structures 30 and the wafer-level substrate 1 are separated and not in contact with the adhesive layer 2.

Second Embodiment

Figure 10:
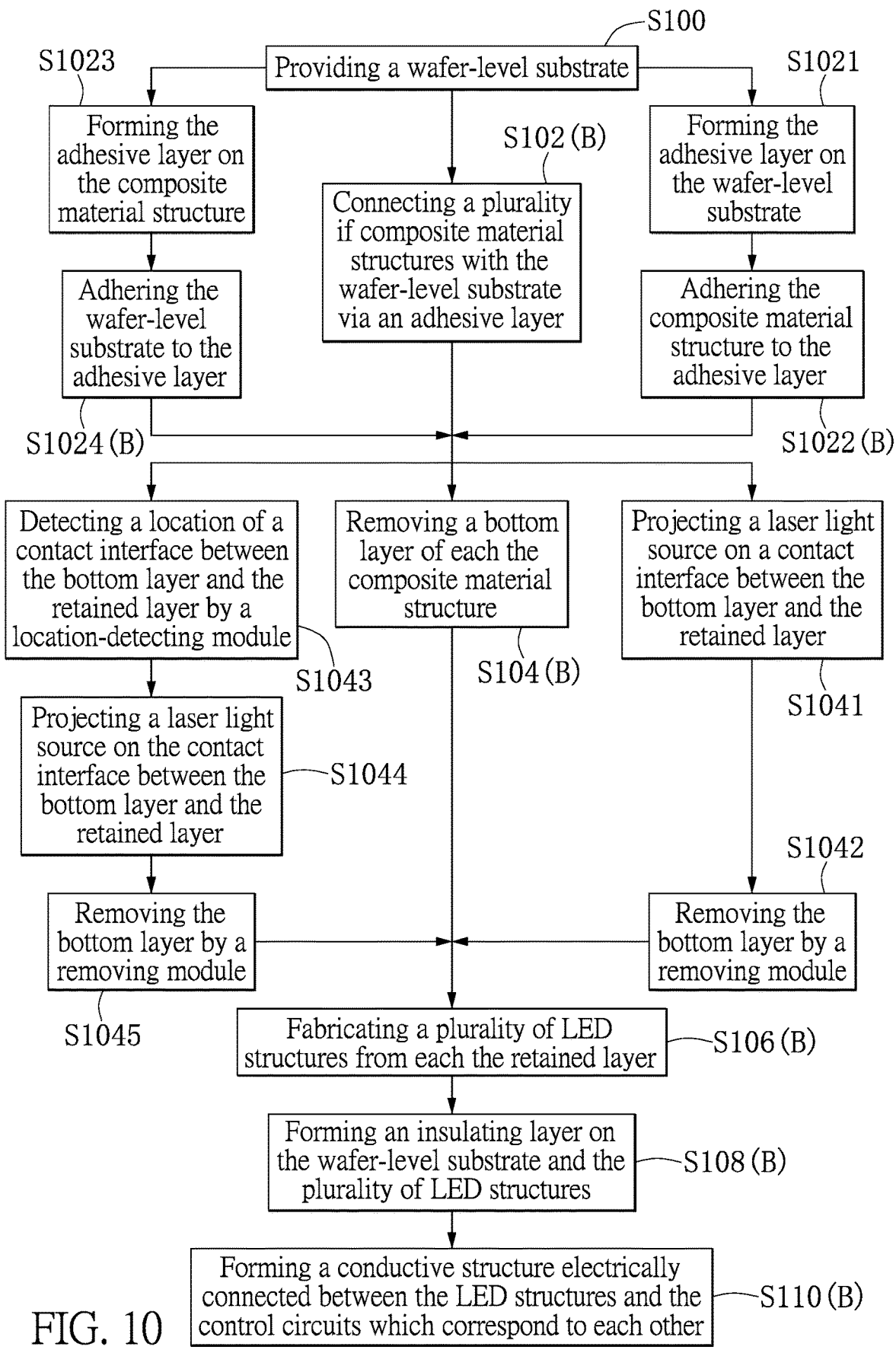
FIG. 10 is a flowchart of the method for manufacturing the micro LED display according to a second embodiment of the present disclosure.
Figure 11:
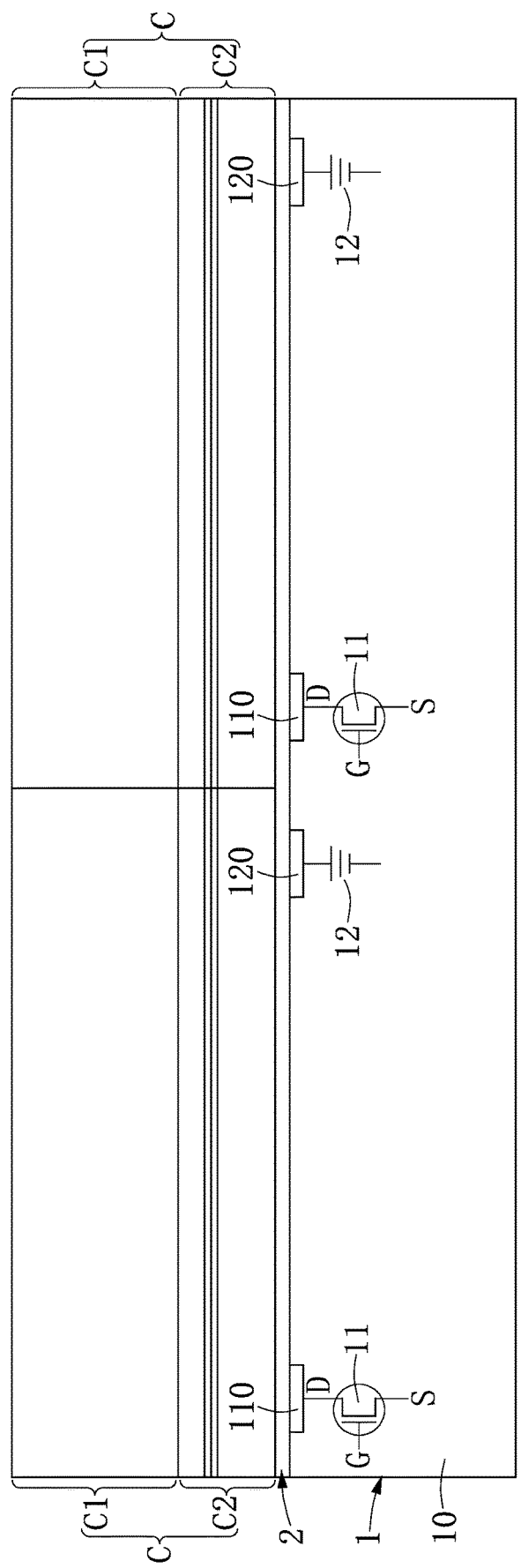
FIG. 11 is a schematic view of step S102(B) of the method for manufacturing the micro LED display according to the second embodiment of the present disclosure.
Figure 12:
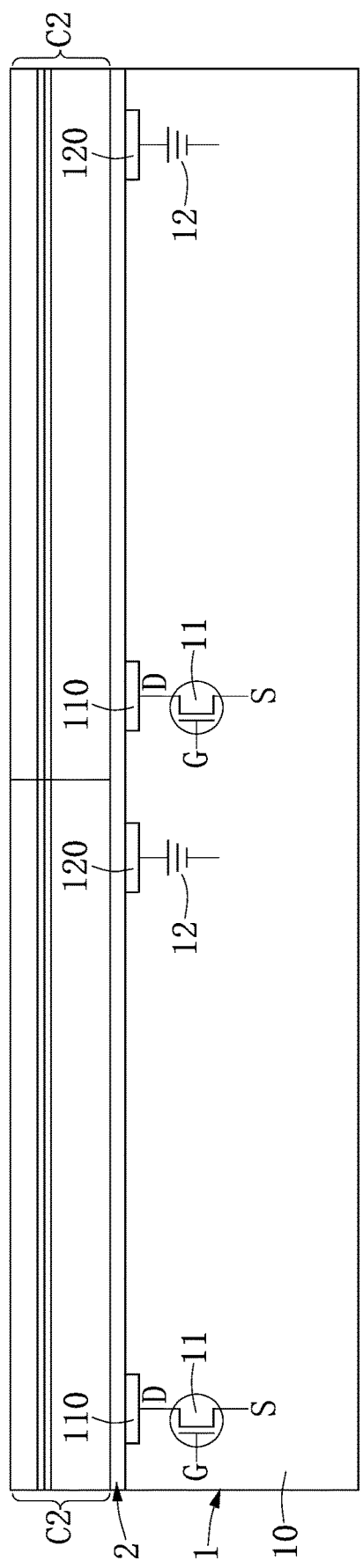
FIG. 12 is a schematic view of step S104(B) of the method for manufacturing the micro LED display according to the second embodiment of the present disclosure.
Figure 13:
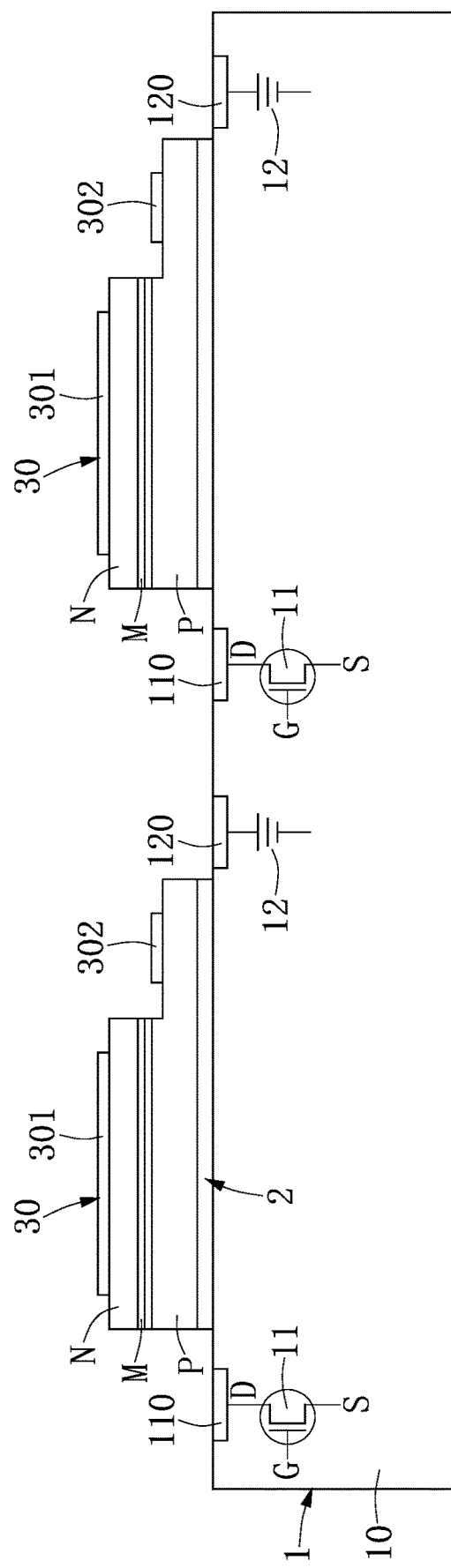
FIG. 13 is a schematic view of step S106(B) of the method for manufacturing the micro LED display according to the second embodiment of the present disclosure.
Figure 14:
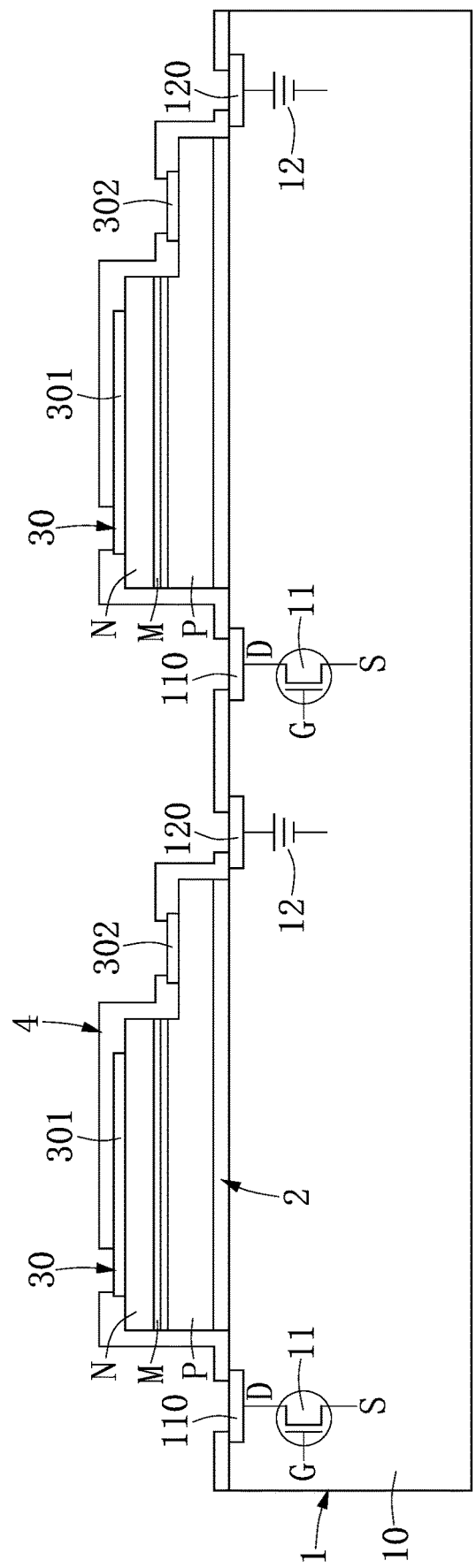
FIG. 14 is a schematic view of step S108(B) of the method for manufacturing the micro LED display according to the second embodiment of the present disclosure.
Figure 15:
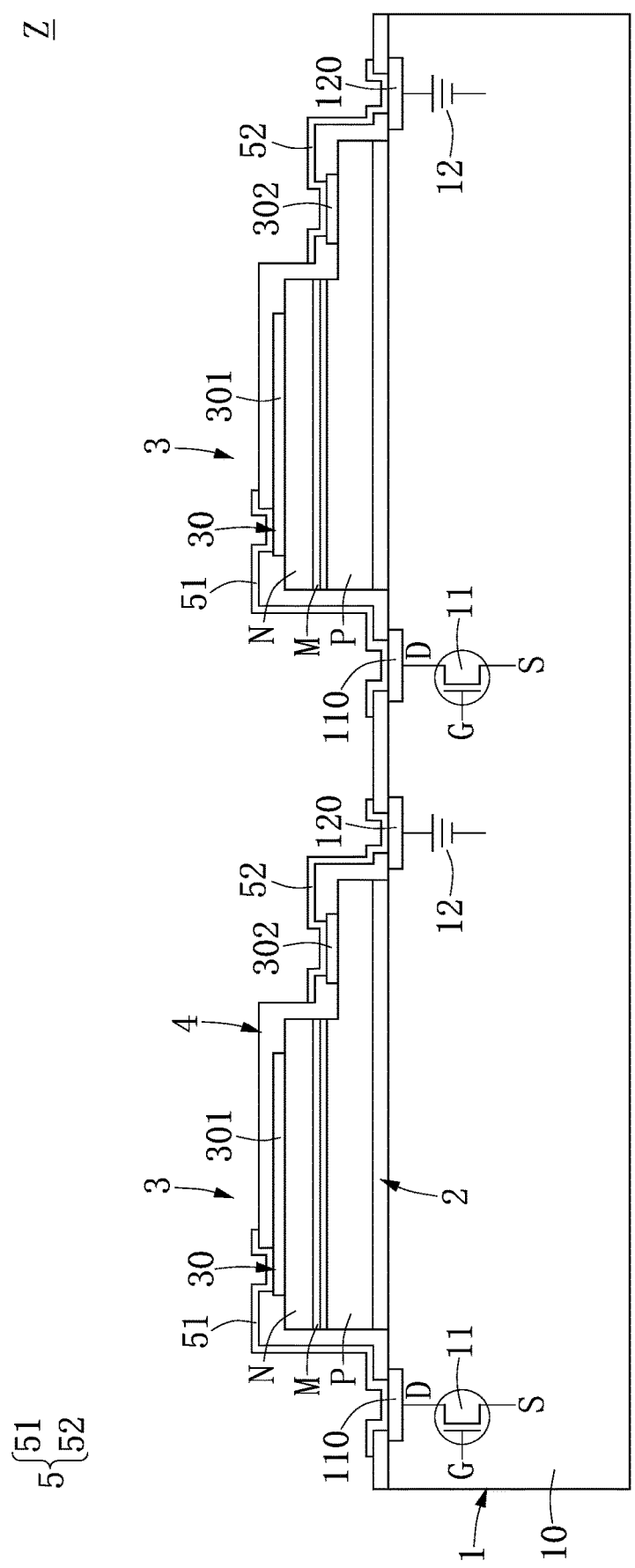
FIG. 15 is a schematic view of step S110(B) of the method for manufacturing the micro LED display according to the second embodiment of the present disclosure.

Referring to FIG. 10 to FIG. 15, a micro LED display Z and a method for manufacturing the micro LED display of a second embodiment of the present disclosure are provided. According to a comparison of FIG. 10 with FIG. 1, a comparison of FIG. 11 with FIG. 5, a comparison of FIG. 12 with FIG. 6, a comparison of FIG. 13 with FIG. 7, a comparison of FIG. 14 with FIG. 8, and a comparison of FIG. 15 with FIG. 9, the method for manufacturing the micro LED display of the second embodiment of the present disclosure includes that a plurality of composite material structure C is firstly connected with a wafer-level substrate 1 via an adhesive layer 2 as shown in FIG. 10 and FIG. 11 (step S102(B)). Then, a bottom layer C1 of each of the composite material structures C is removed and a retained layer C2 of each of the composite material structures C is retained as shown in FIG. 10 and FIG. 12 (step S104(B)). Subsequently, a plurality of LED structures 30 are fabricated from the retained layer C2 of each of the composite material structures C as shown in FIG. 10 and FIG. 13 (step S106 (B)). Then, an insulating layer 4 is formed on the wafer-level substrate 1 and the plurality of LED structures 30 as shown in FIG. 10 and FIG. 14 (step S108(B)). Finally, a conductive structure 5 is formed and electrically connected between the LED structures 30 and the control circuits 11 corresponding each other as shown in FIG. 10 and FIG. 15 (step S110(B)).

Further, referring to FIG. 15, each of the light-emitting assemblies 3 includes a plurality of LED structures 30 disposed on the adhesive layer 2 and not contacting the wafer-level substrate 1. The insulating layer 4 is formed on the wafer-level substrate 1 and the plurality of light-emitting assemblies 3. The plurality of light-emitting assemblies 3 are disposed adjacent to each other to arrange into a pixel array. For example, the adhesive layer 2 can be replaced by a plurality of adhesive units which respectively correspond to the LED structures 30. In other words, each of the LED structures 30 is disposed on the wafer-level substrate 1 in coordination with the corresponding adhesive unit. In practice, each of the light-emitting assemblies 3 includes a plurality of LED structures 30, but only one of the LED structures 30 of each of the light-emitting assemblies 3 is shown in FIG. 11 to FIG. 15 for ease of illustration.

Accordingly, each of the light-emitting assemblies 3 practically includes a plurality of LED structures 30 so "each of the light-emitting assemblies 3 including a plurality of LED structures 30" can adhere to "the wafer-level substrate 1 including a plurality of control circuits 11" via the adhesive layer 2. In other words, utilization of the adhesive layer 2 in the second embodiment allows the plurality of light-emitting assemblies 3 to be adhered to the wafer-level substrate 1 causing the micro LED display Z to have a larger displaying area by joining together the plurality of the light-emitting assemblies 3.

Furthermore, the step of S102(B) further includes that the adhesive layer 2 is formed on the wafer-level substrate 1 (step S1021). Then, the composite material structure C is adhered to the adhesive layer 2 to make the composite material structure C connect with the wafer-level substrate 1 (step S1022(B)). Or, the step of S102(B) further includes that the adhesive layer 2 is formed on the composite material structure C (step S1023). Then, the adhesive layer 2 is adhered to the wafer-level substrate 1 to make the composite material structure C connect with the wafer-level substrate 1 (step S1024(B)).

In conclusion, the micro LED display Z and the method for manufacturing the same of the present disclosure have the technical features of "disposing the adhesive layer 2 on the wafer-level substrate 1, and the light-emitting assembly 3 including the plurality of LED structures 30 disposed on the adhesive layer 2" or "connecting a composite material structure C with the wafer-level substrate 1 via the adhesive layer 2, removing a bottom layer C1 of the composite material structure C, retaining a retained layer C2 of the composite material structure C, and fabricating the plurality of LED structures 30 disposed on the adhesive layer 2 from the retained layer C2 of the composite material structure C" to connect "the light-emitting assembly 3 including the plurality of LED structures 30" and "the wafer-level substrate 1 having the plurality of control circuits 11" with each other via the adhesive layer 2.

It should be noted that, the retained layer C2 can be fabricated into the plurality of LED structures 30 by semiconductor processing so that the size of each of the plurality of LED structures 30 can be reduced and the distance between any two adjacent LED structures 30 can be shortened to enhance an image resolution of the micro LED display Z.

Further, in practice, each of the light-emitting assemblies 3 includes a plurality of LED structures 30 so that "each light-emitting assembly 3 including a plurality of LED structures 30" can be adhered to "the wafer-level substrate 1 having a plurality of control circuits 11". In other words, utilization of the adhesive layer 2 of the present disclosure allows the plurality of light-emitting assemblies 3 to be adhered to the wafer-level substrate 1, causing the micro LED display Z to have a larger displaying area by joining together the plurality of the light-emitting assemblies 3.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:
1. A micro LED display, comprising:
a wafer-level substrate including a wafer body, a plurality of control circuits built in the wafer body, and a plurality of ground circuits built in the wafer body, wherein each of the plurality of control circuits has a conductive contact exposed from the wafer body, and each of the plurality of ground circuits has a ground contact exposed from the wafer body;

an adhesive layer disposed on the wafer body;

a light-emitting assembly including a plurality of LED structures disposed on the adhesive layer and not contacting the plurality of LED structures of the wafer-level substrate, wherein each of the LED structures has a first electrode terminal and a second electrode terminal;

an insulating layer formed on the wafer-level substrate and the light-emitting assembly, wherein the conductive contact of each of the control circuits, the ground contact of each of the ground circuits, and the first electrode terminal and the second electrode terminal of each of the LED structures are exposed from the insulating layer; and a conductive structure including a plurality of first conductive layers and a plurality of second conductive layers, wherein each of the first conductive layers is electrically connected between the corresponding first electrode terminal and the corresponding conductive contact, and each of the second conductive layers is electrically connected between the corresponding second electrode terminal and the corresponding ground contact.

2. The micro LED display according to claim 1, wherein the wafer-level substrate is any one of a polished silicon wafer, an epitaxial silicon wafer, an argon anneal silicon wafer, a hai silicon wafer, and a silicon on insulator silicon wafer, and the control circuit is a CMOS control circuit; wherein a coefficient of thermal expansion of the adhesive layer and a coefficient of thermal expansion of the wafer-level substrate are the same or close to each other, and the adhesive layer is any one of a polyetheretherketone adhesive layer, a benzocyclobutene adhesive layer, and a hydrogen silsesquioxane adhesive layer; wherein each of the LED structures includes an n-type conductive layer, a light-emitting layer, and a p-type conductive layer, the n-type conductive layer is an n-type gallium nitride material layer, the light-emitting layer is a multiple quantum well structure layer, and the p-type conductive layer is a p-type gallium nitride material layer; wherein each of the first conductive layers extends along the insulating layer and fully covers the corresponding first electrode terminal and the corresponding conductive contact, and each of the second conductive layers extends along the insulating layer and fully covers the corresponding second electrode terminal and the corresponding ground contact.

3. A micro LED display, comprising:

a wafer-level substrate including a plurality of control circuits, and each of the control circuits having a conductive contact, wherein the wafer-level substrate includes a plurality of ground circuits, and each of the ground circuits has a ground contact;

an adhesive layer disposed on the wafer-level substrate;

a light-emitting assembly including a plurality of LED structures disposed on the adhesive layer, wherein each of the LED structures has a first electrode terminal and a second electrode terminal;

an insulating layer formed on the wafer-level substrate and the light-emitting assembly, wherein the conductive contact of each of the control circuits, the ground contact of each of the ground circuits, and the first electrode terminal and the second electrode terminal of each of the LED structures are exposed from the insulating layer; and a conductive structure electrically connected between the LED structures and the control circuits corresponding to each other, wherein the conductive structure includes a plurality of first conductive layers and a plurality of second conductive layers, each of the first conductive layers is electrically connected between the corresponding first electrode terminal and the corresponding conductive contact, and each of the second conductive layers is electrically connected between the corresponding second electrode terminal and the corresponding ground contact.

* * * * *